(12) United States Patent
Hirata

(10) Patent No.: US 11,372,835 B2
(45) Date of Patent: Jun. 28, 2022

(54) DATA MANAGEMENT SYSTEM

(71) Applicant: FUJIFILM Business Innovation Corp., Tokyo (JP)

(72) Inventor: Motoharu Hirata, Kanagawa (JP)

(73) Assignee: FUJIFILM Business Innovation Corp., Tokyo (JP)

( * ) Notice: Subject to any disclaimer, the term of this patent is extended or adjusted under 35 U.S.C. 154(b) by 260 days.

(21) Appl. No.: 16/533,726

(22) Filed: Aug. 6, 2019

(65) Prior Publication Data
US 2020/0301904 A1 Sep. 24, 2020

(30) Foreign Application Priority Data
Mar. 19, 2019 (JP) .............................. JP2019-051941

(51) Int. Cl.
| | | |
|---|---|---|
| *G06F 16/20* | (2019.01) | |
| *G06F 16/22* | (2019.01) | |
| *H03M 7/30* | (2006.01) | |
| *G06F 16/23* | (2019.01) | |
| *G06F 16/21* | (2019.01) | |

(52) U.S. Cl.
CPC ........ *G06F 16/2282* (2019.01); *G06F 16/219* (2019.01); *G06F 16/2365* (2019.01); *H03M 7/30* (2013.01)

(58) Field of Classification Search
CPC .............. G06F 16/2282; G06F 16/219; G06F 16/2365; H03M 7/30
See application file for complete search history.

(56) References Cited

U.S. PATENT DOCUMENTS

| | | | | |
|---|---|---|---|---|
| 5,253,275 A | * | 10/1993 | Yurt ....................... | H04H 20/40 348/E5.002 |
| 6,813,384 B1 | * | 11/2004 | Acharya ............. | H04N 19/1883 375/E7.04 |
| 10,943,311 B1 | * | 3/2021 | Svenson ................ | G06Q 50/12 |
| 2004/0068658 A1 | * | 4/2004 | Arisaka ................ | G06Q 20/401 713/176 |
| 2010/0211583 A1 | * | 8/2010 | Basso .................... | G06F 16/116 707/756 |
| 2010/0329256 A1 | * | 12/2010 | Akella .................... | H04L 47/10 370/392 |
| 2013/0060740 A1 | * | 3/2013 | Ono ........................ | G06F 16/81 707/693 |

(Continued)

FOREIGN PATENT DOCUMENTS

| | | |
|---|---|---|
| JP | 2001299307 | 10/2001 |
| JP | 2007257209 | 10/2007 |

*Primary Examiner* — Tarek Chbouki
(74) *Attorney, Agent, or Firm* — JCIPRNET

(57) ABSTRACT

A data management system includes a process reception processing unit that receives input of data in each of processes in plural stages of an item, a compression processing unit that compresses the received data in a case where the process reception processing unit receives the data, and stores the compressed data into a compressed data database, and a decompression processing unit that decompresses the compressed data stored in the compressed database at the predefined date and time before an acquisition process of acquiring data in another process, stored in the compressed database is started, and stores the decompressed data into a decompressed database, the acquisition process being included in the processes in the plural stages.

18 Claims, 9 Drawing Sheets

(56) References Cited

U.S. PATENT DOCUMENTS

2013/0251277 A1\* 9/2013 Yamaguchi ............. G06T 9/004
        382/233
2019/0132480 A1\* 5/2019 Hiramoto ........... H04N 1/00233
2019/0251136 A1\* 8/2019 Yamamoto .............. H03M 7/30

\* cited by examiner

FIG. 5A

| MANAGEMENT NUMBER | ITEM | FIRST PROCESS | SECOND PROCESS | THIRD PROCESS | FORTH PROCESS | FIFTH PROCESS | SIXTH PROCESS |
|---|---|---|---|---|---|---|---|
| | | ESTIMATE | REQUEST FOR APPROVAL | CONTRACT | DELIVERY | BILLING | MONEY RECEPTION MANAGEMENT |
| K01 | PURCHASE | PROPOSAL /INTRODUCTION DOCUMENT | APPROVAL DOCUMENT | ORDER FORM | STATEMENT OF DELIVERY | BILL | RECEIPT |
| | | WRITTEN ESTIMATE | | CONFIRMATION OF ORDER | INSPECTION DOCUMENT | | |
| | | | | APPLICATION FORM | | | |
| | | | | NON-DISCLOSURE AGREEMENT | | | |
| | | | | BASIC AGREEMENT | | | |
| | | | | MEMORANDUM | | | |

FIG. 5B

| MANAGEMENT NUMBER | ITEM | FIRST PROCESS | SECOND PROCESS | THIRD PROCESS | FORTH PROCESS |
|---|---|---|---|---|---|
| | | DOCUMENT α CREATION | DOCUMENT β CREATION | OPERATION HISTORY ACQUISITION | SUBMISSION |
| K10 | AUDIT | DOCUMENT α | DOCUMENT β | DOCUMENT γ | SUBMITTED DOCUMENT |

FIG. 6A

| ITEM ID | MANAGEMENT NUMBER | SUMMARY | FIRST PROCESS | SECOND PROCESS | THIRD PROCESS | ⋮ |
|---|---|---|---|---|---|---|
| PURCHASE P003 | K01 | PROGRESS: 20% ※NON-COMPLETION CREATION DATE AND TIME: 10/11/2018 END DATE AND TIME: - | PROGRESS: 100% COMPLETION START DATE AND TIME: 10/11/2018 END DATE AND TIME: 10/31/2018 | PROGRESS: 0% ※NON-COMPLETION START DATE AND TIME: 10/31/2018 END DATE AND TIME: - | PROGRESS: 0% ※NON-COMPLETION START DATE AND TIME: - END DATE AND TIME: - RETRIEVAL SETTING OF ACQUISITION SCHEDULED HISTORY: - ASPECT TIME PERIOD: 01/2018 TO 12/2018 DATA ACQUISITION TARGET: FIRST PROCESS DATA PRE-ACQUISITION STATUS: 12/01/2018 START PROGRESS EXPECTATION EXECUTED DATE AND TIME: 11/20/2018 | ⋮ |

FIG. 6B

| ITEM ID | MANAGEMENT NUMBER | SUMMARY | FIRST PROCESS | SECOND PROCESS | THIRD PROCESS | ⋮ |
|---|---|---|---|---|---|---|
| AUDIT P003 | K10 | PROGRESS: 20% ※NON-COMPLETION CREATION DATE AND TIME: 10/06/2018 END DATE AND TIME: - | PROGRESS: 100% COMPLETION START DATE AND TIME: 10/06/2018 END DATE AND TIME: 10/23/2018 | PROGRESS: 0% ※NON-COMPLETION START DATE AND TIME: 10/23/2018 END DATE AND TIME: - | PROGRESS: 0% ※NON-COMPLETION START DATE AND TIME: - END DATE AND TIME: - RETRIEVAL SETTING OF ACQUISITION SCHEDULED HISTORY: - ASPECT TIME PERIOD: 01/2016 TO 12/2018 HISTORY ACQUISITION TARGET: 01/2018 TO 06/2018 END K01 HISTORY PRE-ACQUISITION STATUS: UNACQUIRED PROGRESS EXPECTATION EXECUTED DATE AND TIME: 11/15/2018 | ⋮ |

FIG. 7

| HISTORY ID | ITEM ID | OPERATION DATE AND TIME | OPERATOR | OPERATION TARGET | OPERATION CONTENT |
|---|---|---|---|---|---|
| H0001 | PURCHASE P001 | 06/21/2018 10h:07m:50s | HANAKO FUJI | PROPOSAL/INTRODUCTION DOCUMENT.pptx | STORING DOCUMENT |
| H0002 | PURCHASE P001 | 07/03/2018 13h:21m:15s | TARO FUJI | FIRST PROCESS | CHANGING PROGRESS |
| H0003 | PURCHASE P002 | 07/28/2018 14h:51m:31s | TARO FUJI | WRITTEN ESTIMATE.docx | STORING DOCUMENT |
| H0004 | PURCHASE P002 | 07/30/2018 14h:37m:16s | TARO FUJI | WRITTEN ESTIMATE.docx | READING DOCUMENT |
| H0005 | PURCHASE P002 | 07/31/2018 15h:17m:56s | TARO FUJI | WRITTEN ESTIMATE.docx | EDITING DOCUMENT |
| H0006 | AUDIT P003 | 10/05/2018 11h:28m:37s | TARO FUJI | AUDIT P003 | FIRST CREATION OF ITEM |
| H0007 | PURCHASE P003 | 10/09/2018 17h:11m:05s | HANAKO FUJI | PURCHASE P003 | SETTING UPDATE OF ITEM |

FIG. 8A

| ITEM ID | MANAGEMENT NUMBER | SUMMARY | FIRST PROCESS | SECOND PROCESS | THIRD PROCESS | ... |
|---|---|---|---|---|---|---|
| PURCHASE P001 | K01 | PROGRESS: 100% COMPLETION<br>CREATION DATE AND TIME: 06/12/2018<br>END DATE AND TIME: 10/18/2018 | PROGRESS: 100% COMPLETION<br>START DATE AND TIME: 06/12/2018<br>END DATE AND TIME: 07/03/2018 | PROGRESS: 100% COMPLETION<br>START DATE AND TIME: 07/03/2018<br>END DATE AND TIME: 08/06/2018 | PROGRESS: 100% COMPLETION<br>START DATE AND TIME: 08/06/2018<br>END DATE AND TIME: 09/13/2018 | ... |
| PURCHASE P002 | K01 | PROGRESS: 100% COMPLETION<br>CREATION DATE AND TIME: 07/02/2018<br>END DATE AND TIME: 11/11/2018 | PROGRESS: 100% COMPLETION<br>START DATE AND TIME: 07/03/2018<br>END DATE AND TIME: 08/01/2018 | PROGRESS: 100% COMPLETION<br>START DATE AND TIME: 08/02/2018<br>END DATE AND TIME: 09/03/2018 | PROGRESS: 100% COMPLETION<br>START DATE AND TIME: 09/03/2018<br>END DATE AND TIME: 10/08/2018 | ... |

FIG. 8B

| ITEM ID | MANAGEMENT NUMBER | SUMMARY | FIRST PROCESS | SECOND PROCESS | THIRD PROCESS | ... |
|---|---|---|---|---|---|---|
| AUDIT P001 | K10 | PROGRESS: 100% COMPLETION<br>CREATION DATE AND TIME: 10/05/2016<br>END DATE AND TIME: 01/18/2017 | PROGRESS: 100% COMPLETION<br>START DATE AND TIME: 10/05/2016<br>END DATE AND TIME: 10/20/2016 | PROGRESS: 100% COMPLETION<br>START DATE AND TIME: 10/20/2016<br>END DATE AND TIME: 11/05/2016 | PROGRESS: 100% COMPLETION<br>START DATE AND TIME: 11/05/2016<br>END DATE AND TIME: 12/19/2016 | ... |
| AUDIT P002 | K10 | PROGRESS: 100% COMPLETION<br>CREATION DATE AND TIME: 10/02/2017<br>END DATE AND TIME: 01/11/2018 | PROGRESS: 100% COMPLETION<br>START DATE AND TIME: 10/02/2017<br>END DATE AND TIME: 10/15/2017 | PROGRESS: 100% COMPLETION<br>START DATE AND TIME: 10/15/2017<br>END DATE AND TIME: 10/29/2017 | PROGRESS: 100% COMPLETION<br>START DATE AND TIME: 10/29/2017<br>END DATE AND TIME: 12/18/2017 | ... |

# DATA MANAGEMENT SYSTEM

CROSS-REFERENCE TO RELATED APPLICATIONS

This application is based on and claims priority under 35 USC 119 from Japanese Patent Application No. 2019-051941 filed Mar. 19, 2019.

BACKGROUND

(i) Technical Field

The present invention relates to a data management system.

(ii) Related Art

JP2007-257209A discloses a log data compression program for compressing log data, the log data compression program causing a computer function as an update log file storing a log record; a reflection time database in which a data reflection time for each log type is stored; a decompression time database in which a data decompression time per unit data amount is stored; a reflection time calculation unit that obtains a sum total of reflection time required for each log in order from leading log data of a compression target log file; a decompression time calculation unit that obtains a sum total of decompression time required for each log in reverse order from a tailing log record of the compression target log file; a time comparison unit that compares the sum total of reflection time with the sum total of decompression time; a unit that acquires data of the next log record with respect to the time of the sum total is smaller; and a compression unit that performs a compression process on log data included in the sum total of decompression time when a log record number which is a calculation target of the reflection time is equal to or more than a log record number which is a calculation target of the decompression time.

SUMMARY

Aspects of non-limiting embodiments of the present disclosure relate to a data management system enabling data to be referred to faster than in a case where compressed data is decompressed for reference after a process of referring to data is started.

Aspects of certain non-limiting embodiments of the present disclosure address the above advantages and/or other advantages not described above. However, aspects of the non-limiting embodiments are not required to address the advantages described above, and aspects of the non-limiting embodiments of the present disclosure may not address advantages described above.

According to an aspect of the present disclosure, there is provided a data management system including a process reception processing unit that receives input of data in each of processes in a plurality of stages of an item; a compression processing unit that compresses the received data and stores the compressed data into a compressed data database, in a case where the process reception processing unit receives the data; and a decompression processing unit that decompresses the compressed data stored in the compressed database and stores the decompressed data into a decompressed database, at the predefined date and time before an acquisition process of acquiring data in another process, stored in the compressed database is started, the acquisition process being included in the processes in the plurality of stages.

BRIEF DESCRIPTION OF THE DRAWINGS

Exemplary embodiment(s) of the present invention will be described in detail based on the following figures, wherein:

FIGS. 5A and 5B are diagrams illustrating examples of processes in a plurality of stages of an item according to the exemplary embodiment of the present invention;

FIGS. 6A and 6B are diagrams illustrating examples of progress statuses of processes stored in a database according to the exemplary embodiment of the present invention;

FIG. 7 a diagram illustrating an example of history data stored in the database according to the exemplary embodiment of the present invention;

FIGS. 8A and 8B are diagrams illustrating an example of data stored in a past item database according to the exemplary embodiment of the present invention;

DETAILED DESCRIPTION

Figure 1:
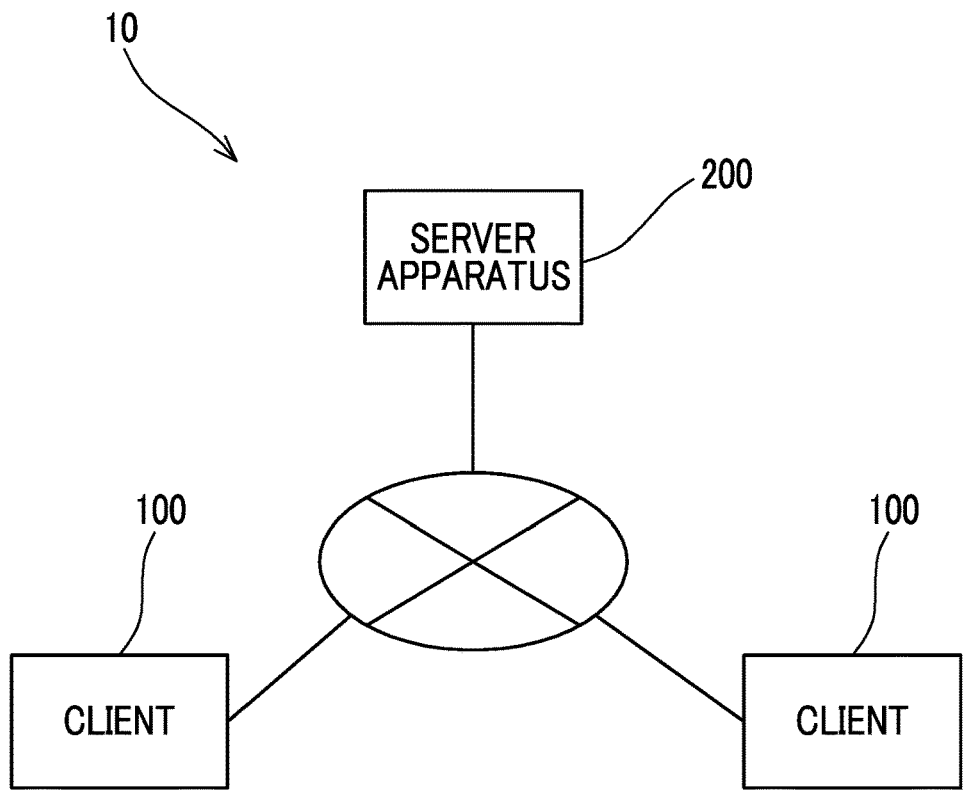
FIG. 1 is a schematic configuration diagram illustrating a data management system according to an exemplary embodiment of the present invention.

Hereinafter, an example of an exemplary embodiment of the present disclosure will be described with reference to the accompanying drawings. An identical reference numeral is given to like or equivalent constituent elements and portions throughout the drawings. A dimension ratio in the drawings is exaggerated for convenience of description and may thus be different from an actual ratio.

FIG. 1 is a diagram illustrating a schematic configuration of a data management system 10 according to the present exemplary embodiment.

As illustrated in FIG. 1, the data management system 10 is configured to include clients 100 and a server apparatus 200 that are connected to each other via communication means such as a network. As the communication means, as will be described later, various networks such as the Internet or Ethernet (registered trademark) may be used. In FIG. 1, two clients 100 and a single server apparatus 200 are illustrated, but the number thereof is not limited thereto.

Figure 2:
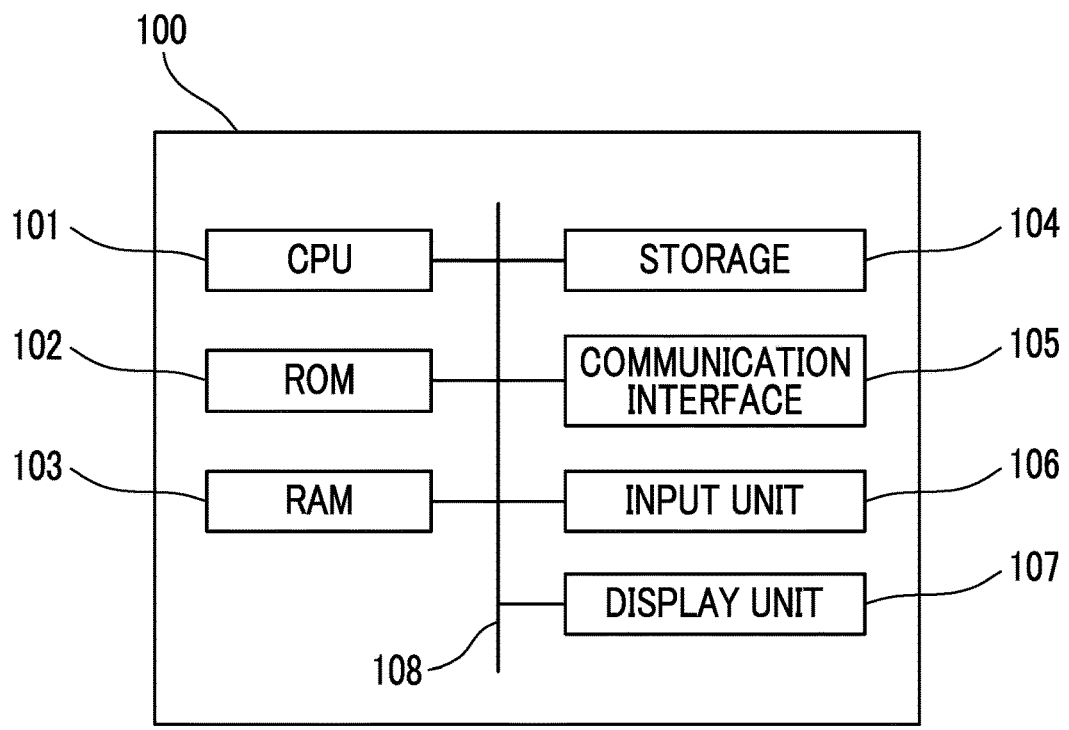
FIG. 2 is a schematic block diagram illustrating a client according to the exemplary embodiment of the present invention.

FIG. 2 is a block diagram illustrating a hardware configuration of the client 100.

As illustrated in FIG. 2, the client 100 includes a central processing unit (CPU) 101, a read only memory (ROM) 102, a random access memory (RAM) 103, a storage 104, a communication interface 105, an input unit 106, and a display unit 107. The respective constituent elements are communicably connected to each other via a bus 108.

The CPU 101 is a central operation processing unit, and executes various programs or controls each unit. In other words, the CPU 101 reads a program from the ROM 102 or the storage 104, and executes the program with the RAM 103 as a work region. The CPU 101 performs control of each constituent element and various operation processes according to the program recorded on the ROM 102 or the storage 104. In the present exemplary embodiment, programs are stored in the ROM 102 or the storage 104.

The ROM 102 stores various programs and various pieces of data. The RAM 103 is a work region and temporarily stores programs or data. The storage 104 is configured with a hard disk drive (HDD) or a solid state drive (SSD), and stores various programs including an operating system, and various pieces of data.

The communication interface 105 is an interface used to perform communication with other apparatuses such as the server apparatus 200, and employs a standard such as the Internet, Ethernet (registered trademark), FDDI, or Wi-Fi (registered trademark).

The input unit 106 includes a pointing device such as a mouse, and a keyboard, and is used to perform various inputs.

The display unit 107 is, for example, a liquid crystal display, and displays various pieces of information. The display unit 107 may function as the input unit 106 by using a touch panel type.

Figure 3:
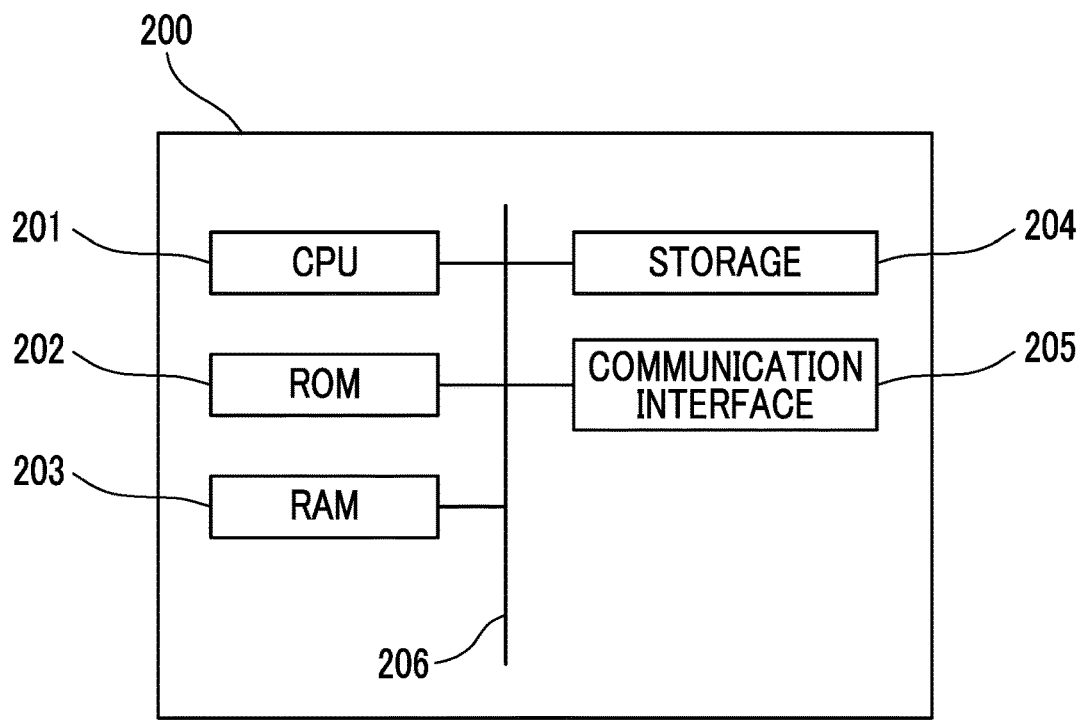
FIG. 3 is a schematic block diagram illustrating a server apparatus according to the exemplary embodiment of the present invention.

FIG. 3 is a block diagram illustrating a hardware configuration of the server apparatus 200.

As illustrated in FIG. 3, the server apparatus 200 includes a CPU 201, a ROM 202, a RAM 203, a storage 204, and a communication interface 205. The respective constituent elements are communicably connected to each other via a bus 206.

The CPU 201 is a central operation processing unit, and executes various programs or controls each unit. In other words, the CPU 201 reads a program from the ROM 202 or the storage 204, and executes the program with the RAM 203 as a work region. The CPU 201 performs control of each constituent element and various operation processes according to the program recorded on the ROM 202 or the storage 204. In the present exemplary embodiment, programs and various databases are stored in the ROM 202 or the storage 204.

The ROM 202 stores various programs and various pieces of data. The RAM 203 is a work region and temporarily stores programs or data. The storage 204 is configured with an HDD or an SSD, and stores various programs including an operating system, and various pieces of data.

The communication interface 205 is an interface used to perform communication with other apparatuses such as the client 100, and employs a standard such as Ethernet (registered trademark), FDDI, or Wi-Fi (registered trademark).

The server apparatus 200 may be provided with an input unit that includes a pointing device such as a mouse, and a keyboard, and is used to perform various inputs, or a display unit such as a liquid crystal display that displays various pieces of information.

Figure 4:
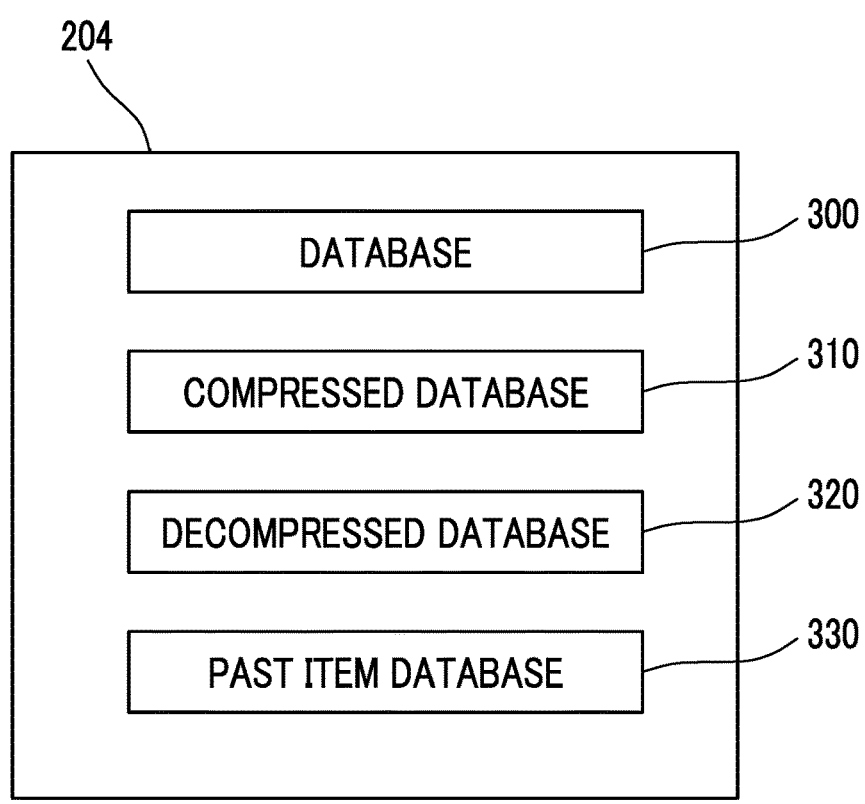
FIG. 4 is a block diagram illustrating an example of a functional configuration of a ROM or a storage of the server apparatus according to the exemplary embodiment of the present invention.

The storage 204 of the server apparatus 200 has, as illustrated in FIG. 4, storage regions as a database 300, a compressed database 310, a decompressed database 320, and a past item database 330, and stores various pieces of data.

The database 300 stores data received by a process reception processing unit 210 (refer to FIG. 9) which will be described later, or the types of data stored in processes in a plurality of stages of an item illustrated in FIGS. 5A and 5B and a progress status of each process.

The data stored in the database 300 is compressed at a predefined timing by a compression processing unit 220 (refer to FIG. 9) which will be described later, and is stored in the compressed database 310.

Here, with reference to FIGS. 5A and 5B, a description will be made of processes in a plurality of stages of an item stored in the database 300.

FIGS. 5A and 5B are diagrams for describing examples of items. As an item, FIG. 5A illustrates an item example of "purchase", and illustrates processes in a plurality of stages of the item of "purchase" and data (document) stored in each process. Hereinafter, the item of "purchase" will be simply referred to as a "purchase" item.

This item is configured with a first process "estimate", a second process "request for approval", a third process "contract", a fourth process "delivery", a fifth process "billing", and a sixth process "money reception management", and indicates that work is performed in this order.

A proposal/introduction document and a written estimate are stored in the first process "estimate"; an approval document is stored in the second process "request for approval"; an order form, Confirmation of order, an application form, a non-disclosure agreement, a basic agreement, and a memorandum are stored in the third process "contract"; a statement of delivery and an inspection document are stored in the fourth process "delivery"; a bill is stored in the fifth process "billing"; and a receipt is stored in the sixth process "money reception management".

Data stored in each process is not limited to the above-described data, and other data may be stored.

"K01" as a management number is assigned to the "purchase" item of the present example. An identical management number is assigned to a "purchase" item having an identical configuration of processes in a plurality of stages among a plurality of different "purchase" items.

In other words, an identical management number is assigned to a "purchase" item having the same processes and data stored in each process as those of the "purchase" item of the present example. On the other hand, even in a case of a "purchase" item, a separate is assigned to a "purchase" item that is different from the "purchase" item of the present example in terms of different processes and data stored in each process.

Thus, in a case where a new item is to be registered in the data management system, an operator of the client 100 selects a corresponding management number from a screen displayed on the display unit 107 via the input unit 106. In a case where the management number is selected, processes in a plurality of stages and data stored in each process are collectively selected.

The processes in a plurality of stages include an acquisition process of acquiring data in other processes, stored in the compressed database.

In the present example, for example, the third process "contract" is set to the acquisition process, and the data in the first process "estimate" is set to be acquired in the process.

As an item, FIG. 5B illustrates an item example of "audit", and illustrates processes in a plurality of stages of the item of "audit" and data (document) stored in each process. Hereinafter, the item of "audit" will be simply referred to as an "audit" item.

This item is configured with a first process "document α creation", a second process "document β creation", a third process "operation history acquisition", and a fourth process "submission", and indicates that work is performed in this order. A document α is stored in the first process "document α creation"; a document β is stored in the second process "document β creation"; a document γ is stored in the third process "operation history acquisition"; and a submitted document is stored in the fourth process "submission". Data stored in each process is not limited to the above-described data, and other data may be stored.

"K10" as a management number is assigned to the "audit" item of the present example. An identical management number is assigned to an "audit" item having an identical configuration of processes in a plurality of stages among a plurality of different "audit" item.

In other words, an identical management number is assigned to an "audit" item having the same processes and data stored in each process as those of the "audit" item of the present example. On the other hand, even in a case of an "audit" item, a separate is assigned to an "audit" item that is different from the "audit" item of the present example in terms of different processes and data stored in each process.

The processes in a plurality of stages include an acquisition process of acquiring data in other processes, stored in the compressed database.

In the present example, for example, the third process "operation history acquisition" is set to the acquisition process, and an operation history for a target item corresponding to the "audit" item is set to be acquired.

With reference to FIG. 6, progress statuses of processes stored in the database 300 will be described.

FIG. 6A illustrates one of the "purchase" items in FIG. 5A, stored in the database 300, and illustrates an example of a progress status of the "purchase" item assigned with "purchase P003" as an item ID.

Specifically, FIG. 6A illustrates that first creation of the item is performed on Oct. 11, 2018 (category of summary), the first process is started on Oct. 11, 2018 and is finished on Oct. 31, 2018 (category of the first process), and the second process is started on Oct. 31, 2018 (category of the second process).

The start date and time or the end date and time of each process is input by an operator of the client 100, but is not limited thereto. The start date and time of each process may be set to the next date of the end date of the previous process, and the end date and time of each process may be set to the date on which all data to be stored in the process is stored.

Similarly, FIG. 6B illustrates one of the "audit" items in FIG. 5B, stored in the database 300, and illustrates an example of a progress status of the "audit" item assigned with "audit P003" as an item ID.

Specifically, FIG. 6A illustrates that first creation of the item is performed on Oct. 6, 2018 (category of summary), the first process is started on Oct. 6, 2018 and is finished on Oct. 23, 2018 (category of the first process), and the second process is started on Oct. 23, 2018 (category of the second process).

Data received by the process reception processing unit 210 which will be described later includes an operation history including storage, editing, or reading of the data in the database 300 as illustrated in FIG. 7.

Thus, the operation history is also compressed at a predefined timing by the compression processing unit 220, and is stored in the compressed database.

Here, a description will be made of an operation history with reference to FIG. 7.

The operation history is divided into categories such as a history ID and an item ID numbered consecutively, the operation date and time, an operator, an operation target, and an operation content, and stores that, for example, in the history ID "H0001", with respect to the item ID "purchase P001", Hanako FUJI stored the document "proposal/introduction document.pptx" at 10:07:50 on Jun. 21, 2018.

It is stored that, in the history ID "H0007", with respect to the item ID "purchase P002", taro FUJI edited the document "written estimate.docx" at 15:17:56 on Jul. 31, 2018.

The operation history is not limited to such categories, and may store other categories.

The operation history illustrated in FIG. 7 is compressed for each history and is stored in the compressed database 310, but is not limited thereto, an operation history may be separately compressed for each item, all operation histories may be compressed for items having an identical management number, that is, operation histories for the identical management number "K01" may be compressed, and all operation histories may be compressed regardless of an item ID.

The compressed database 310 stores data that is received by the process reception processing unit 210 and is compressed by the compression processing unit 220.

The decompressed database 320 stores data decompressed by the decompression processing unit 230.

The decompressed database 320 is not limited to a case of being provided in the same server apparatus 200 as that of the compressed database 310, and may be provided in the server apparatus 200 that is different from that of the compressed database 310.

In other words, the decompressed database 320 may acquire compressed data stored in the compressed database 310, and may store the compressed data into the decompressed database 320 provided in the server apparatus 200 that is different from that of the compressed database 310, so as to decompress the compressed data. Alternatively, the compressed data may be decompressed in the compressed database 310, and may then be stored into the decompressed database 320 provided in the server apparatus 200 that is different from that of the compressed database 310. Alternatively, the compressed data may be acquired from the compressed database 310 by another server apparatus 200, so as to be decompressed, and may be stored in the decompressed database 320 provided in a separate server aspect.

As the server apparatus 200, there may be the server apparatus 200 with a charge system that charges for acquisition (download) of data and the server apparatus 200 with a charge system that charges for storage (upload) of data. The server apparatus 200 that charges for acquisition of data may be combined with a plurality of server apparatuses 200 such that compressed data is acquired without being decompressed, and thus the data management system 10 that does not make a charge may be built.

The past item database 330 stores information regarding a past item.

The information regarding a past item includes a progress status of each process of the past item as illustrated in FIGS. 8A and 8B.

Here, with reference to FIGS. 8A and 8B, a description will be made of a progress status of a process of a past item stored in the past item database 330.

FIG. 8A illustrates examples of progress statuses of item IDs "purchase P001" and "purchase P002" as the "purchase" items in FIG. 5A, stored in the past item database 330.

Specifically, it is illustrated that first creation of the item with "purchase P001" is performed on Jun. 12, 2018 (category of summary), the first process is started on Jun. 12, 2018 and is finished on Jul. 3, 2018 (category of the first process), the second process is started on Jul. 3, 2018 and is finished on Aug. 6, 2018 (category of the second process), the third process is started on Aug. 6, 2018 and is finished on Sep. 13, 2018 (category of the third process), and the item with "purchase P001" is finished on Oct. 18, 2018 (category of summary).

Similarly, it is illustrated that first creation of the item with "purchase P002" is performed on Jul. 2, 2018 (category of summary), the first process is started on Jul. 3, 2018 and is finished on Aug. 1, 2018 (category of the first process), the second process is started on Aug. 2, 2018 and is finished on Sep. 3, 2018 (category of the second process), the third process is started on Sep. 3, 2018 and is finished on Oct. 3, 2018 (category of the third process), and the item with "purchase P002" is finished on Nov. 11, 2018 (category of summary).

Similarly, FIG. 8B illustrates examples of progress statuses of item IDs "audit P001" and "audit P002" as the "audit" items in FIG. 5B, stored in the past item database 330.

Specifically, it is illustrated that first creation of the item with "audit P001" is performed on Oct. 5, 2016 (category of summary), the first process is started on Oct. 5, 2016 and is finished on Oct. 20, 2016 (category of the first process), the second process is started on Oct. 20, 2016 and is finished on Nov. 5, 2016 (category of the second process), the third process is started on Nov. 5, 2016 and is finished on Dec. 19, 2016 (category of the third process), and the item with "audit P001" is finished on Jan. 18, 2017 (category of summary).

Similarly, it is illustrated that first creation of the item with "audit P002" is performed on Oct. 2, 2017 (category of summary), the first process is started on Oct. 2, 2017 and is finished on Oct. 15, 2017 (category of the first process), the second process is started on Oct. 15, 2017 and is finished on Oct. 29, 2017 (category of the second process), the third process is started on Oct. 29, 2017 and is finished on Dec. 18, 2017 (category of the third process), and the item with "audit P002" is finished on Jan. 11, 2018 (category of summary).

The server apparatus 200 realizes various functions by using the hardware resources. Functional configurations realized by the server apparatus 200 will be described.

Figure 9:
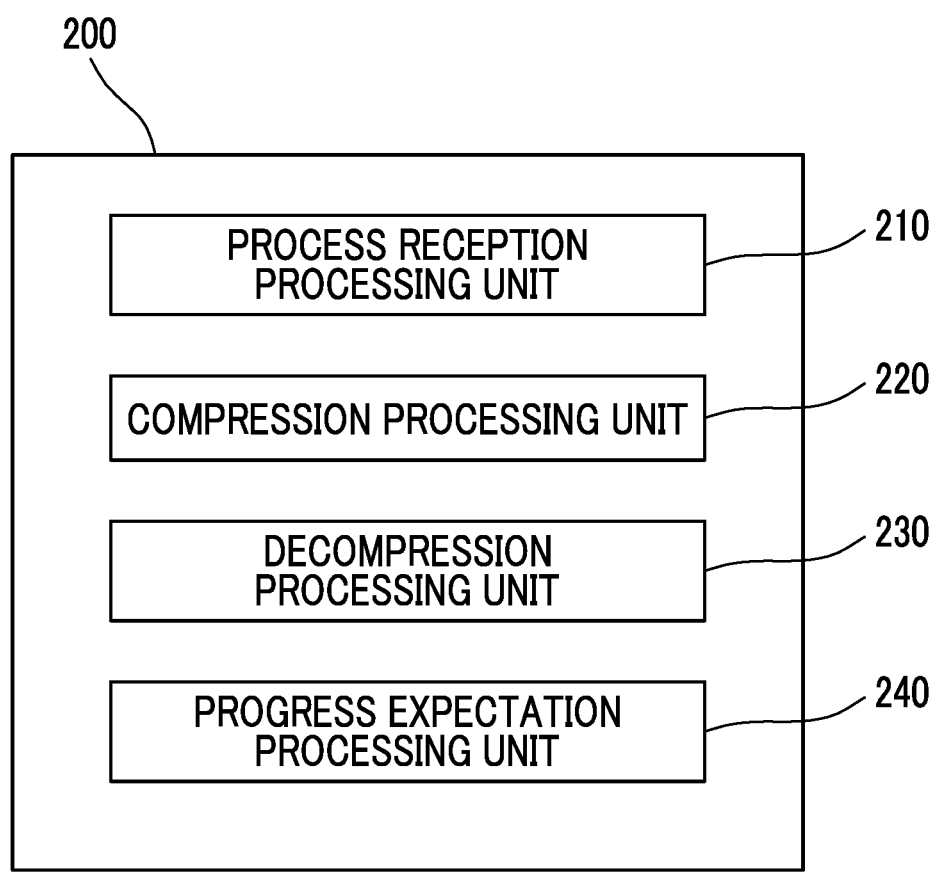
FIG. 9 is a block diagram illustrating an example of a functional configuration of the server apparatus according to the exemplary embodiment of the present invention.

FIG. 9 is a block diagram illustrating an example of a functional configuration of the server apparatus 200.

As illustrated in FIG. 9, the server apparatus 200 includes, as functional configurations, the process reception processing unit 210, the compression processing unit 220, a decompression processing unit 230, and a progress expectation processing unit 240. Each functional configuration is realized by the CPU 201 reading a program stored in the ROM 202 or the storage 204 and executing the program.

The process reception processing unit 210 receives input of data for defining processes in a plurality of stages of an item, that is, information for determining a process needed for each item, input of information for determining data such as a document needed in each process, or input of data in each of processes in a plurality of stages of an item.

In a case where data is received by the process reception processing unit 210, the compression processing unit 220 compresses the received data, and stores the data into the compressed database 310.

A timing at which the compression processing unit 220 compresses data may be the same time as a timing at which the process reception processing unit 210 receives the data, but is not limited thereto, and may be a timing after a predefined time elapses from reception of data, for example, after a process of receiving the data is completed.

The decompression processing unit 230 decompresses compressed data stored in the compressed database 310 at the predefined date and time before an acquisition process is started, and stores the data into the decompressed database 320. As described above, the processes in a plurality of stages include the acquisition process of acquiring data in another process, stored in the compressed database 310.

Here, the predefined date and time before the acquisition process is started is the date and time expected by the progress expectation processing unit 240 as will be described later in the present exemplary embodiment. However, the present exemplary embodiment is not limited thereto, and the predefined date and time before the acquisition process is started may be set by an operator of the client 100 based on the past experience in a case where an item is first created. Alternatively, regarding the predefined date and time before the acquisition process is started, the predefined date and time from the start date and time may be set as a default.

Among past items stored in the past item database 330, the progress expectation processing unit 240 expects the predefined date and time by using an average processing time for a common process of a past item that is common to an item in which data is to be acquired through the acquisition process in terms of a process before the acquisition process.

A description will be made of an example of progress expectation with reference to FIGS. 6A, 6B, 8A, and 8B.

FIG. 6A illustrates an example of a case where data is acquired.

In the category of the third process in FIG. 6A, a range of a past item of which an average processing time is obtained among past items is set to "retrieval setting of acquisition scheduled history". In the present example, an item with the management number "K01" started from January, 2018 to December, 2018 is set as a past item of which an average processing time is obtained. Among the processes in a plurality of stages, a process in which data is stored to be acquired is set as a "data acquisition target". In the present example, data stored in the first process is set to be acquired. As "data pre-acquisition status", it is stored that data starts to be acquired on Dec. 1, 2018, that is, starts to be decompressed by the decompression processing unit 230, and is currently acquired. The date and time of the progress expected by the progress expectation processing unit 240 is stored in "progress expectation executed date and time". In a case where the "data pre-acquisition status" does not reach the date and time expected by the progress expectation processing unit 240, data is not acquired.

Here, in the present example, data stored in the first process of the identical item ID "purchase P003" is acquired in the third process.

This is because data is created in the subsequent third process by referring to the data stored in the previous first process. The time for which data not compressed is stored in the server apparatus 200 is reduced as much as possible compared with a case where data stored in the first process is preserved without being compressed, and thus a data usage amount in the server apparatus 200 is reduced. In a case where the data usage amount is reduced, this can contribute to a reduction of a charge.

The progress expectation processing unit 240 expects the date and time at which the third process is started based on the "retrieval setting of acquisition scheduled history" and the "data acquisition target".

Specifically, first, a past item corresponding to the "retrieval setting of acquisition scheduled history" is determined from the past item database 330. In the present example, a description will be made assuming that the item IDs "purchase P001" and "purchase P002" in FIG. 8A correspond thereto.

The date and time at which the third process of the determined past item is started is calculated. In the present example, in the item ID "purchase P001", a processing time is 53 days from Jun. 12, 2018 on which the first process is started to Aug. 6, 2018 on which the second process is finished. In the item ID "purchase P002", a processing time is 63 days from Jun. 3, 2018 on which the first process is started to Sep. 3, 2018 on which the second process is finished. Thus, an average processing time is 58 days.

The start date and time of the first process of the item ID "purchase P003" is Oct. 11, 2018, and thus the end of the second process, that is, the expected start date and time of the third process is Dec. 8, 2018 after 63 days.

Thus, the decompression processing unit 230 decompresses the data stored in the "first process" stored in the compressed database 310 up to the expected start date and time.

In the present example, the data is decompressed a predefined time before the expected start date and time, for example, a week before, but is not limited thereto, and the time required for decompression may be calculated based on a capacity of compressed data stored in the compressed database 310, and decompression may be started the calculated required time before.

With this configuration, the time required for decompression can be accurately calculated compared with decompression is started a predefined time before, and thus it is possible to reduce the time required to store decompressed data into the decompressed database 320.

In the present example, the expected start date and time is determined based on an average processing time, but is not limited thereto, and the expected start date and time may be determined based on a past item in which a processing time is shorted, that is, 53 days in "purchase P001".

With this configuration, even in an item in which a processing time is shorter than an average processing time, decompression processing is finished at the time of starting of a process, and thus the process can be started without wait for the decompression processing.

As a time for which decompressed data stored in the decompressed database 320 becomes longer, a charge for using the server apparatus 200 is frequently increased, and thus it is preferable to reduce a time for which the decompressed data is stored in the decompressed database 320. Thus, in a case where an average processing time is determined, a more accurate average processing time may be determined except for a past item in which a processing time is shorted and a past item in which a processing time is longest.

In a case where an average processing time cannot be calculated, for example, in a case where there is only a single past item corresponding to an "aspect time period", a progress status of the past item may be set as the expected start date and time, and may be set by an operator of the client 100.

FIG. 6B illustrates an example of a case where history data regarding an operation history is acquired. In the category of the third process in FIG. 6B, a range of a past item of which an average processing time is obtained among past items is set to "retrieval setting of acquisition scheduled history". In the present example, an item with the management number "K10" started from January, 2016 to December, 2018 is set as a past item of which an average processing time is obtained. History data to be acquired is set as a "history acquisition target". In the present example, history data stored in the management number "K01" finished in June, 2018 starting from January, 2018 is set to be acquired. As a "history pre-acquisition status", it is stored that history is not acquired, that is, decompression is not started by the decompression processing unit 230. The date and time of the progress expected by the progress expectation processing unit 240 is stored in "progress expectation executed date and time".

Here, in the item ID "audit P003", unlike in FIG. 6A, history data stored in the management number "K01" that is another item is acquired.

This is because the present item is a process of auditing other items, and thus history data of another audit target item is acquired.

The progress expectation processing unit 240 expects the date and time at which the third process is started based on the "retrieval setting of acquisition scheduled history" and the "history acquisition target".

Specifically, first, a past item corresponding to the "retrieval setting of acquisition scheduled history" is determined from the past item database 330. In the present example, a description will be made assuming that the item IDs "audit P001" and "audit P002" in FIG. 8B correspond thereto.

The date and time at which the third process of the determined past item is started is calculated. In the present example, in the item ID "audit P001", a processing time is 31 days from Oct. 5, 2016 on which the first process is started to Nov. 5, 2016 on which the second process is finished. In the item ID "audit P002", a processing time is 27 days from Oct. 2, 2017 on which the first process is started to Oct. 29, 2017 on which the second process is finished. Thus, an average processing time is 29 days.

The start date and time of the first process of the item ID "audit P003" is Oct. 6, 2018, and thus the end of the second process, that is, the expected start date and time of the third process is Nov. 4, 2018 after 29 days.

Thus, the decompression processing unit 230 decompresses the data stored in the management number "K01" stored in the compressed database 310 up to the expected start date and time.

Next, a description will be made of an operation of the data management system 10.

Figure 10:
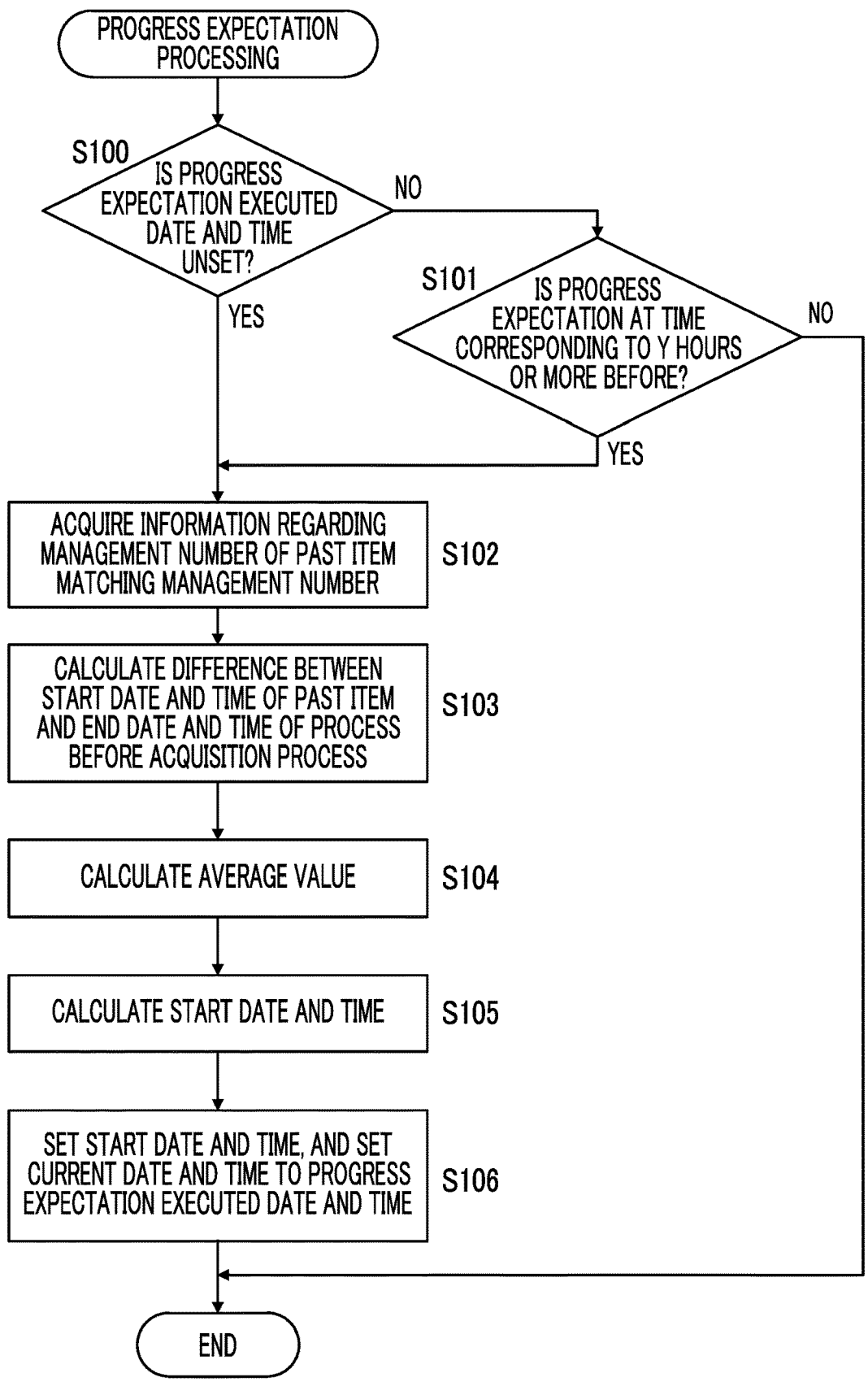
FIG. 10 is a flowchart illustrating an example of a flow of progress expectation processing according to the exemplary embodiment of the present invention.

FIG. 10 is a flowchart illustrating a flow of progress expectation processing performed by the data management system 10. The CPU 201 reads a program from the ROM 202 or the storage 204, develops the program into the RAM 203, and executes the program, and thus the progress expectation processing is performed.

First, in step S100, the CPU 201 (progress expectation processing unit 240) determines whether or not the progress expectation executed date and time is unset. In other words, it is determined whether or not the progress expectation processing is not performed yet, and the field of the progress expectation executed date and time of the past item database illustrated in FIG. 6 is "unset" (not illustrated). In a case where it is determined that the progress expectation executed date and time is not unset (step S100: NO), that is, in a case where the progress expectation executed date and time is set, the flow proceeds to the subsequent step S101. In a case where it is determined that the progress expectation executed date and time is unset (step S100: YES), the flow proceeds to the subsequent step S102.

The determination process in step S100 is performed every predefined time.

In step S101, the CPU 201 determines whether or not the progress expectation executed date and time determined in step S100 is progress expectation at the time corresponding to Y hours or more before. In other words, it is determined whether or not the progress expectation executed date and time is old information. In a case where it is determined that the progress expectation executed date and time determined is not progress expectation at the time corresponding to Y hours or more before (step S101: NO), the processing is finished. On the other hand, in a case where it is determined that the progress expectation executed date and time determined is progress expectation at the time corresponding to Y hours or more before (step S101: YES), the flow proceeds to the subsequent step S102.

In step S102, the CPU 201 acquires information regarding a management number of a past item matching a management number of an item in which progress expectation is executed, from the past item database. Here, the acquired information of the past item includes information regarding the start date and time and the end date and time of each process of the past item. The flow proceeds to the subsequent step S103.

In step S103, the CPU 201 calculates a difference between the start date and time of the past item and the end date and time of a process before the acquisition process. The flow proceeds to the subsequent step S104.

In step S104, the CPU 201 calculates an average value (average processing time) of the difference calculated in step S103. The flow proceeds to the subsequent step S105.

In step S105, the CPU 201 calculates the start date and time of the acquisition process based on the average value (average processing time) calculated in step S104. The flow proceeds to the subsequent step S106.

In step S106, the CPU 201 sets the start date and time of the acquisition process, and sets the current date and time (the date and time at which progress is expected) to the progress expectation executed date and time (refer to FIGS. 6A and 6B). The processing is finished.

Figure 11:
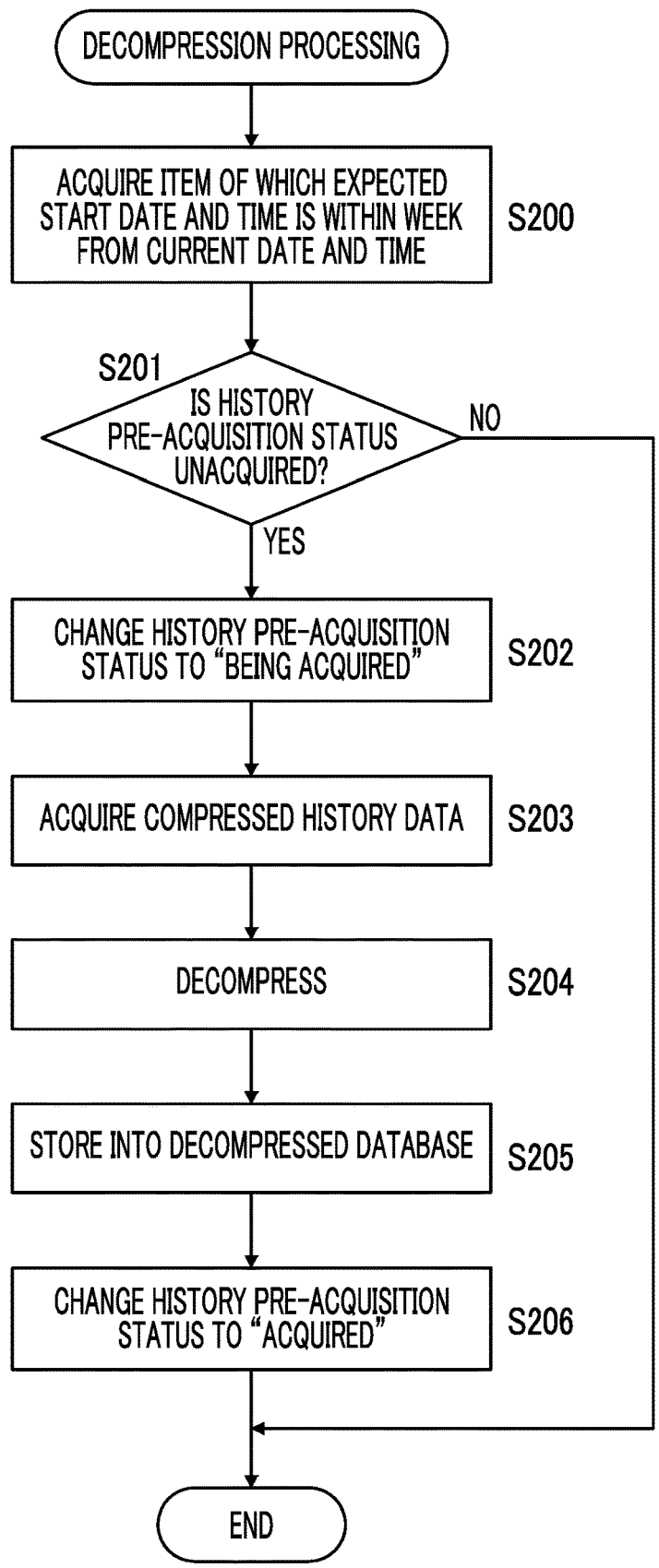
FIG. 11 is a flowchart illustrating an example of a flow of decompression processing according to the exemplary embodiment of the present invention.

FIG. 11 is a flowchart illustrating an example of a flow of decompression processing performed by the data management system 10. In the present example, a description will be made by using an example of history data decompression processing. The CPU 201 reads a program from the ROM 202 or the storage 204, develops the program into the RAM 203, and executes the program, and thus the decompression processing is performed.

First, the CPU 201 (decompression processing unit 230) acquires items of which the expected start date and time set in step S106 in FIG. 10 is within a week from the current date and time in step S200. The flow proceeds to the subsequent step S201.

In step S202, it is determined whether or not a history pre-acquisition status of the database 300 is unacquired (refer to FIG. 6B). In a case where the history pre-acquisition status is not unacquired, that is, is being acquired or has been acquired, the processing is finished. In a case where the history pre-acquisition status is unacquired, the flow proceeds to the subsequent step S202.

In step S202, the CPU 201 changes the history pre-acquisition status to "being acquired". The flow proceeds to the subsequent step S203.

In step S203, the CPU 201 acquires compressed history data from the compressed database 310. The flow proceeds to the subsequent step S204.

In step S204, the CPU 201 decompresses the compressed history data acquired in step S203. The flow proceeds to the subsequent step S205.

In step S205, the CPU 201 stores the history data decompressed in step S204 into the decompressed database 320. The flow proceeds to the subsequent step S206.

In step S206, the CPU 201 changes the history pre-acquisition status of the database 300 to "acquired". The processing is finished.

In the exemplary embodiment, the progress expectation processing and the decompression processing executed by the CPU 201 reading software (program) may be executed by various processors other than the CPU 201. Examples of the processors in this case may include a programmable logic device (PLD) such as a field-programmable gate array (FPGA) of which a circuit configuration is changeable after being manufactured, and a dedicated electric circuit that is a processor having a circuit configuration specially designed in order to execute specific processing, such as an application specific integrated circuit (ASIC). The progress expectation processing and the decompression processing may be executed by one of the various processors, and may be executed by a combination of identical types or different types of two or more processors (for example, a combination of a plurality of FPGAs or a combination of a CPU and an FPGA). A hardware structure of each of the various processors is, for example, an electric circuit in which circuit elements such as semiconductor elements are combined with each other.

In the exemplary embodiment, a description has been made of an aspect in which the programs for the progress expectation processing and the decompression processing are stored (installed) in the ROM 202 or the storage 204 in advance, but this is only an example. The program may be provided in a form of being recorded on recording media such as a compact disk read only memory (CD-ROM), a digital versatile disk read only memory (DVD-ROM), and a Universal Serial Bus (USB) memory. The program may be provided in a form of being downloaded from an external device via a network.

Modification Example

The present invention is not limited to the exemplary embodiment, and may be variously modified or altered within the scope without departing from the spirit of the invention.

An access history to data in each process of a past item may be stored in the past item database 330, and the decompression processing unit 230 may extract data to be decompressed from compressed data stored in the compressed database 310 based on the access history.

In other words, for example, even in a case where the "data acquisition target" (refer to FIG. 6A) is the "first process", data accessed in a past item is decompressed instead of decompressing all data stored in the first process.

With this configuration, only necessary data can be decompressed instead of all data such that an amount of decompressed data can be reduced, and thus it is possible to reduce a decompression time or a storage region of the server apparatus 200 preserving decompressed data.

An upper limit of an amount of data extracted in the monthly unit may be set, and decompressed data may be extracted from the decompressed database 320 separately for each month.

With this configuration, even in a case where a charge for use of the server apparatus 200 is made at a stage corresponding to an amount of data extracted in the monthly unit, it is possible to suppress an upper limit of a charge for use of the server apparatus 200 by averaging an extraction amount.

The foregoing description of the exemplary embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A data management system comprising:
    a past item database that stores information of a past item; and
    a processor, configured to:
        receive input of data in each of processes in a plurality of stages of an item;
        compress the received data and store the compressed data into a compressed data database; and
        decompress the compressed data stored in the compressed database and store the decompressed data into a decompressed database at a predefined date and time before an acquisition process is started, wherein the acquisition process is to acquire data in another process included in the processes in the plurality of stages,
    wherein the processor predicts the predefined date and time by using an average processing time for a common process of a past item, that is common to an item in which data is to be acquired through the acquisition process in terms of a process before the acquisition process, among past items stored in the past item database.

2. The data management system according to claim 1,
    wherein a management number is assigned to each item, and an identical management number is assigned to items in which configurations of processes in a plurality of stages are the same as each other, and
    wherein the processor predicts the predefined date and time by using a past item assigned with the same management number as a management number of an item in which data is to be acquired through the acquisition process.

3. The data management system according to claim 2,
    wherein the processor calculates a time required for decompression based on at least a capacity of the compressed data stored in the compressed database, and starts decompression at the required time before the predefined date and time.

4. The data management system according to claim 3,
    wherein an access history to data in each process of the past item is stored in the past item database, and
    wherein the processor extracts data to be decompressed from the compressed data stored in the compressed database based on the access history.

5. The data management system according to claim 2,
    wherein an access history to data in each process of the past item is stored in the past item database, and
    wherein the processor extracts data to be decompressed from the compressed data stored in the compressed database based on the access history.

6. The data management system according to claim 4,
    wherein the received data is history data regarding an operation history on an operation target.

7. The data management system according to claim 3,
    wherein the received data is history data regarding an operation history on an operation target.

8. The data management system according to claim 5,
    wherein the received data is history data regarding an operation history on an operation target.

9. The data management system according to claim 2,
    wherein the received data is history data regarding an operation history on an operation target.

10. The data management system according to claim 1,
    wherein the processor calculates a time required for decompression based on at least a capacity of the compressed data stored in the compressed database, and starts decompression at the required time before the predefined date and time.

11. The data management system according to claim 10,
    wherein an access history to data in each process of the past item is stored in the past item database, and
    wherein the processor extracts data to be decompressed from the compressed data stored in the compressed database based on the access history.

12. The data management system according to claim 11,
    wherein the received data is history data regarding an operation history on an operation target.

13. The data management system according to claim 10,
    wherein the received data is history data regarding an operation history on an operation target.

14. The data management system according to claim 1,
    wherein an access history to data in each process of the past item is stored in the past item database, and
    wherein the processor extracts data to be decompressed from the compressed data stored in the compressed database based on the access history.

15. The data management system according to claim 14,
    wherein the received data is history data regarding an operation history on an operation target.

16. The data management system according to claim 1,
    wherein the received data is history data regarding an operation history on an operation target.

17. The data management system according to claim 16,
    wherein the operation target is a database storing a document, and the operation history includes storage, editing, or reading of the document in the database.

18. The data management system according to claim 1,
    wherein the decompressed database is provided in a server apparatus that is different from a server apparatus in which the compressed database is provided.

* * * * *